United States Patent [19]

Takahashi et al.

[11] Patent Number: 4,814,694

[45] Date of Patent: Mar. 21, 1989

[54] SYSTEM FOR DETECTING AND PROCESSING ABNORMALITY IN ELECTROMAGNETIC SHIELDING OF INTELLIGENT BUILDINGS

[75] Inventors: Takeshi Takahashi; Masatake Nakamura; Yoshiji Yabana; Toshiyuki Ishikawa; Koji Nagata, all of Kyobashi, Japan

[73] Assignee: Shimizu Construction Co., Ltd., Tokyo, Japan

[21] Appl. No.: 195,053

[22] Filed: May 17, 1988

[51] Int. Cl.$^4$ ............................................. G01R 23/00
[52] U.S. Cl. ..................................... 324/95; 324/520; 455/67
[58] Field of Search ................. 324/95, 520; 343/703; 455/67, 226, 115; 340/600; 174/35 MS

[56] References Cited

U.S. PATENT DOCUMENTS 3,531,577  9/1970  Garlington et al. ............ 179/35 MS
4,072,899  2/1978  Shimp ..................................... 324/95
4,631,473  12/1986  Honda ..................................... 324/95

FOREIGN PATENT DOCUMENTS 55-47743  4/1980  Japan .

Primary Examiner—Reinhard J. Eisenzopf
Assistant Examiner—Anthony L. Miele

Attorney, Agent, or Firm—Armstrong, Nikaido, Marmelstein & Kubovcik

[57] ABSTRACT

Disclosed is a system for detecting and processing an abnormality in electromagnetic shielding for use in an intelligent building which is constructed using an electromagnetic shielding material for the skeleton and openings such as windows and doorways so that the whole of the building is formed into an electromagnetic shielding structure in order to carry out radio communication inside the building. The system has radio wave detecting means for detecting an external radio wave inside the building, level judging means for judging the level of an external radio wave detected by the radio wave detecting means, and processing means for detecting and processing an abnormality on the basis of an output from the level judging means, whereby an abnormality in the electromagnetic shielding performance is detected on the basis of the intensity level of a detected radio wave intruding into the building from the outside. When the electromagnetic shielding performance has deteriorated, external radio waves such as broadcast waves, telecast waves, etc. intrude into the building. Therefore, any of these radio waves is constantly monitored by the radio wave detecting means inside the building. Thus, when the electromagnetic shielding performance has considerably deteriorated, the abnormality can be detected by judging the level of the detected radio wave with the level judging means.

3 Claims, 2 Drawing Sheets

SYSTEM FOR DETECTING AND PROCESSING ABNORMALITY IN ELECTROMAGNETIC SHIELDING OF INTELLIGENT BUILDINGS

BACKGROUND OF THE INVENTION

The present invention relates to a system for detecting and processing an abnormality in electromagnetic shielding of an intelligent building which is constructed using an electromagnetic shielding material for the skeleton and openings such as windows and doorways so that the whole of the building is formed into an electromagnetic shielding structure.

It is general practice in intelligent buildings to utilize jointly information communicating equipment such as a composite electronic switching system, a computer, etc. for information communication with the other party inside or outside the building. As a result of an increase in value placed on information and diversification as well as individualization of need for information, there is a rapid increase in the amount of information handled. Under these circumstances, it is a problem for future intelligent buildings how to provide required information quickly at low cost. To solve this problem, there has been studied and proposed an information network adopting a data highway system that utilizes optical fiber cables, coaxial cables or the like.

However, the data highway system of the type described above needs to lay optical fiber cables or coaxial cables throughout the intelligent building so that the cables extend to every terminal equipment, and therefore it necessitates a floor duct and a double-floored structure for laying such cables, resulting in a considerable increase in both the cost of construction and the term of works.

If radio waves are used for information communication, no cables are needed. In such a case, however, since the radio waves may induce noises outside the intelligent building, the use of radio waves comes under the control of radio law; on the other hand, external radio waves may cause malfunction of the system.

Accordingly, the applicant of this invention has already made various propositions concerning an intelligent building which is constructed using an electromagnetic shielding material for the skeleton and openings such as windows and doorways so that the whole of the building is formed into an electromagnetic shielding structure, thereby enabling free radio communication inside the building without suffering from regulation by radio law.

However, even if the whole of the building is constructed as being an electromagnetic shielding structure to enable radio communication inside the building, once the electromagnetic shielding is broken at an part of the building, strong radio waves are continuously released to the outside, causing a problem in terms of radio law. Further, in such a case, the radio communication inside the building is readily affected by external radio waves, resulting in a paralysis of the information transmitting function. Accordingly, it is considerably important in order to avoid such problems to find a defect or deterioration of the electromagnetic shielding in its early stage. However, it is not easy to predict a position where the electromagnetic shielding of an intelligent building will probably be broken. In particular, when the size of the building itself increases, the range of inspection enlarges correspondingly. For this reason, it is considered difficult to make a diagnosis as to whether or not electromagnetic shielding performance is satisfactory, and there has heretofore been no system which is capable of finding a defect or deterioration of electromagnetic shielding of intelligent buildings

SUMMARY OF THE INVENTION

It is a primary object of the present invention to provide a system for detecting and processing an abnormality in electromagnetic shielding which is capable of readily finding deterioration of the electromagnetic shielding performance of an intelligent building and a defect in an electromagnetic shielding structure.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

To attain the above-described object, the present invention provides a system for detecting and processing an abnormality in electromagnetic shielding for use in an intelligent building which is constructed using an electromagnetic shielding material for the skeleton and openings such as windows and doorways so that the whole of the building is formed into an electromagnetic shielding structure in order to carry out radio communication inside the building, the system comprising: radio wave detecting means for detecting an external radio wave inside the building; level judging means for judging the level of an external radio wave detected by the radio wave detecting means; and processing means for detecting and processing an abnormality on the basis of an output from the level judging means, whereby an abnormality in the electromagnetic shielding performance is detected on the basis of the intensity level of a detected radio wave intruding into the building from the outside.

When the electromagnetic shielding performance has deteriorated, external radio waves such as broadcast waves, telecast waves, etc. intrude into the building. Therefore, any of these radio waves is constantly monitored by the radio wave detecting means inside the building. Thus, when the electromagnetic shielding performance has considerably deteriorated, the abnormality can be detected by judging the level of the detected radio wave with the level judging means. Accordingly, it is possible to conduct an appropriate processing by the processing means on the basis of the result of the detection.

DESCRIPTION OF PREFERRED EMBODIMENT

One embodiment of the present invention will be described hereinunder with reference to the accompanying drawings.

Figure 1:
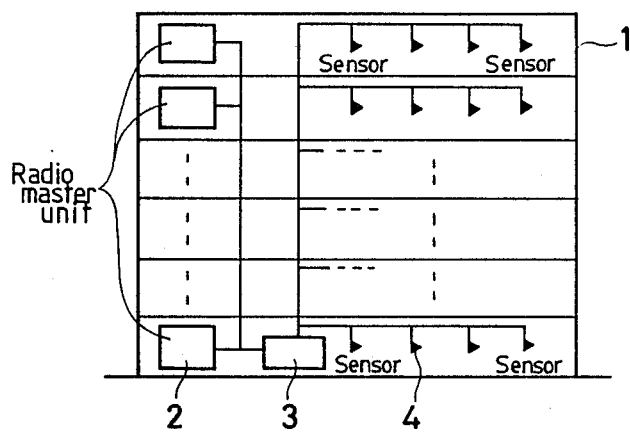
FIG. 1 shows one embodiment of the electromagnetic shielding abnormality detecting system according to the present invention.

Referring to FIG. 1, the reference numeral 1 denotes a building, 2 radio master units, 3 a level checker-area judging unit, 4 sensors, 5 a radio communication system, 6 a display, and 7 a printer.

Figure 2:
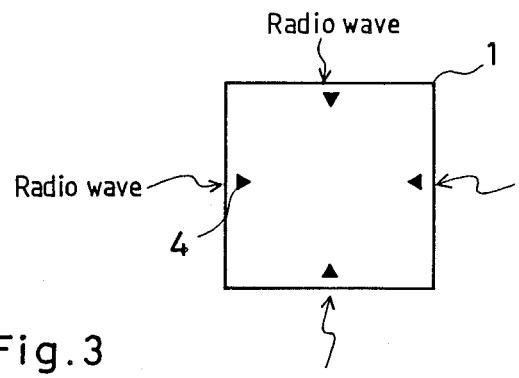
FIG. 2 is a plan view showing one example of disposition of sensors on each floor.
Figure 3:
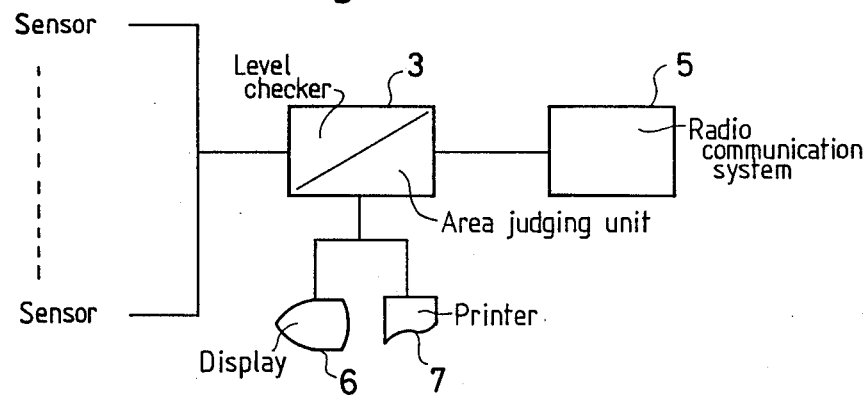
FIG. 3 is a block diagram of the electromagnetic shielding abnormality detecting system according to the present invention.
Figure 4:
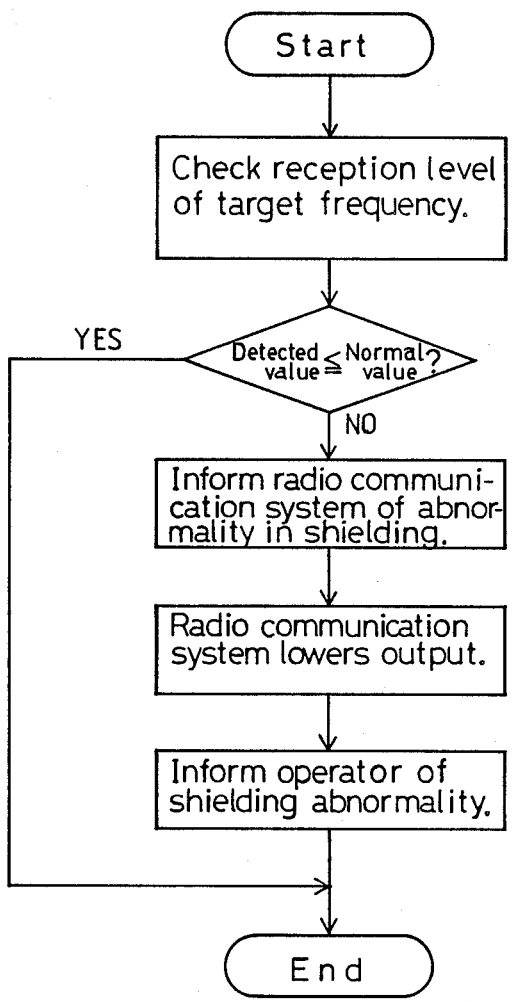
FIG. 4 is a flowchart showing the processing executed by the level checker-area judging unit.

The sensors 4 are disposed in the building 1 to detect radio waves, such as broadcast and telecast waves, which are usually present outside the building 1 in the vicinity of the frequency of a radio wave which is the object of magnetic shielding, that is, the frequency which is assigned to and used for radio communication inside the building 1. In order to increase the degree of accuracy in detection of an abnormality in electromagnetic shielding, it is preferable to dispose the sensors 4 on each floor of the building 1 and in every direction, as shown in FIG. 2, so that it is possible to detect the intensity level of an externally intruding radio wave at each floor and in each direction and it is easy to specify precisely a position where an electromagnetic shielding abnormality occurs. The radio master units 2 are used for radio communication on every floor, while the level checker-area judging unit 3 monitors the signal from each sensor 4 in order to detect an abnormality in electromagnetic shielding. When an abnormality is detected, the level checker-area judging unit 3 controls the radio master unit 2 on the floor where the abnormality is found so as to lower the output level of the radio signal at the floor concerned. FIG. 3 shows a specific example of the system arrangement wherein an external radio wave is detected by each sensor 4 and the level of the detected radio wave is checked to find an abnormal position, while FIG. 4 shows the flow of processing executed by the system.

The level checker-area judging unit 3 checks the level of an external radio wave having a target frequency which is received by each sensor 4 on the basis, for example, of a preset normal value. If the level of the received radio wave exceeds the normal value, the unit 3 recognizes the floor and directional position where the sensor 4 concerned is installed, and delivers to the radio communication system 5 an abnormality detection signal which informs the system 5 of an abnormality in the electromagnetic shielding. In response to the signal, the radio communication system 5 lowers the output level of the signal transmitted from the radio master unit 2 on the floor where the electromagnetic shielding is found to be abnormal, and further activates an acoustic alarm means or an optical (display) alarm means to inform the operator of the occurrence of an abnormality.

In the electromagnetic shielding abnormality detecting system according to the present invention, external radio waves, such as broadcast waves, which are usually present in the vicinity of the frequency of a radio wave which is the object of electromagnetic shielding are monitored inside the building, so that an abnormality in the electromagnetic shielding of the building is detected on the basis of the fact that the level of a received external radio wave exceeds a predetermined normal value, and when an abnormality occurs, the output of the internal radio wave on the floor where the abnormality is found is immediately lowered and, at the same time, an alarm means is activated to inform the operator of the occurrence of an abnormality. Accordingly, it is possible to take a countermeasure promptly without any risk of the electromagnetic shielding being left in an abnormal state for a long time.

It should be noted that the present invention is not necessarily limited to the above-described embodiment and various changes and modifications may be imparted thereto. For example, although in the foregoing embodiment an electromagnetic shielding abnormality is detected according to whether or not the level of a received external radio wave exceeds a normal value and, when an abnormality is found, the output of the internal radio wave on the floor concerned is lowered and the operator is informed of the occurrence of an abnormal situation, it is also possible to diagnose deterioration of the electromagnetic shielding performance by comparison with reception level data or a normal value obtained in the past.

As will be clear from the foregoing description, according to the present invention, lowering or deterioration in the electromagnetic shielding performance is checked on the basis of the level of a received external radio wave. Therefore, it is possible to detect an electromagnetic shielding abnormality with a system which is less costly. In addition, since no movable element is used, it is possible to provide a system which requires no labor and which exhibits high durability.

What we claim is:

1. A system for detecting and processing an abnormality in electromagnetic shielding for use in an intelligent building which is constructed using an electromagnetic shielding material for the skeleton and openings such as windows and doorways so that the whole of the building is formed into an electromagnetic shielding structure in order to carry out radio communication inside said building, said system comprising:
   radio wave detecting means for detecting an external radio wave inside said building;
   level judging means for judging the level of an external radio wave detected by said radio wave detecting means; and
   processing means for detecting and processing an abnormality on the basis of an output from said level judging means,
   whereby an abnormality in the electromagnetic shielding performance is detected on the basis of the intensity level of a detected radio wave intruding into said building from the outside wherein said processing means lowers the output of a radio wave for communication inside said building at an abnormal floor.

2. A system for detecting and processing an abnormality in electromagnetic shielding according to claim 1, wherein said radio wave detecting means is diposed on every floor and in every direction.

3. A system for detecting and processing an abnormality in electromagnetic shielding according to claim 1, wherein said level judging means judges the electromagnetic shielding performance to be abnormal on the basis of the fact that the level of a detected external radio wave exceeds a normal value, and identifies an abnormal floor by the radio wave detecting means concerned.

* * * * *